United States Patent

Reznicek et al.

(10) Patent No.: US 9,472,460 B1
(45) Date of Patent: Oct. 18, 2016

(54) UNIFORM DEPTH FIN TRENCH FORMATION

(71) Applicant: GLOBALFOUNDRIES INC., Grand Cayman (KY)

(72) Inventors: Alexander Reznicek, Troy, NY (US); Kangguo Cheng, Albany, NY (US); Ali Khakifirooz, Los Altos, CA (US); Dominic J. Schepis, Wappingers Falls, NY (US); Pouya Hashemi, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/007,494

(22) Filed: Jan. 27, 2016

(51) Int. Cl.
*H01L 21/8234* (2006.01)
*H01L 29/06* (2006.01)
*H01L 21/228* (2006.01)
*H01L 21/3065* (2006.01)
*H01L 21/02* (2006.01)

(52) U.S. Cl.
CPC . *H01L 21/823431* (2013.01); *H01L 21/02381* (2013.01); *H01L 21/02532* (2013.01); *H01L 21/228* (2013.01); *H01L 21/3065* (2013.01); *H01L 29/0684* (2013.01)

(58) Field of Classification Search
CPC ........... H01L 21/02381; H01L 21/823431; H01L 21/02532; H01L 21/228; H01L 21/3065
See application file for complete search history.

(56) References Cited

U.S. PATENT DOCUMENTS

| 2014/0197458 | A1* | 7/2014 | Ching | H01L 29/7849 257/192 |
| 2015/0108572 | A1* | 4/2015 | Cheng | H01L 27/1211 257/347 |
| 2015/0206875 | A1* | 7/2015 | Lee | H01L 27/0886 257/192 |
| 2015/0279973 | A1* | 10/2015 | Akarvardar | H01L 29/1054 438/283 |
| 2015/0311320 | A1* | 10/2015 | Cheng | H01L 29/66795 438/157 |

* cited by examiner

*Primary Examiner* — Mamadou Diallo
(74) *Attorney, Agent, or Firm* — Yuanmin Cai; Hoffman Warnick LLC

(57) ABSTRACT

Methods for forming substantially uniform depth trenches and/or semiconductor fins from the trenches are disclosed. Embodiments of the method may include depositing a germanium including layer over a substrate, the substrate including a plurality of sacrificial semiconductor fins, each pair of sacrificial semiconductor fins separated by a sacrificial pillar. Germanium is diffused from the germanium including layer into the plurality of sacrificial semiconductor fins to a defined uniform depth. The germanium including layer is removed, and the plurality of sacrificial semiconductor fins are etched to the defined uniform depth and selective to the substrate, creating a plurality of trenches having a substantially uniform depth. The trenches can be used to epitaxial grow semiconductor fins having substantially uniform height.

20 Claims, 4 Drawing Sheets

UNIFORM DEPTH FIN TRENCH FORMATION

BACKGROUND

1. Technical Field

The present disclosure relates to semiconductor fabrication, and more specifically, to forming uniform depth fin trenches and fins.

2. Related Art

In semiconductor devices, semiconductor fins are used for a wide variety of devices such as aspect ratio trapping structures and fin field effect transistors (finFETs). One challenge in forming the fins is ensuring a uniform height of the fins and/or uniform aspect ratios of the fins. As shown in FIG. 1, fin formation typically includes photo-lithographically forming a number of trenches 10 in a substrate 12. In photolithography, a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to undergo etching to form trenches. As also shown in FIG. 1, trenches 10 are filled with sacrificial material pillars 14 by depositing the material and planarizing.

As shown in FIG. 2, a reactive ion etch (RIE) is then performed to create a starting surface 16 on substrate 12 between adjacent pillars 14 upon which fins will be epitaxially grown. RIE is a variation of plasma etching in which, during etching, the semiconductor wafer is placed on an RF powered electrode. The plasma is generated under low pressure (e.g., vacuum pressure) by an electromagnetic field. It uses chemically reactive plasma to remove material deposited on wafers such as substrate 12 between pillars 14. High-energy ions from the plasma attack the wafer surface and react with it. The wafer takes on potential which accelerates etching species extracted from plasma toward the etched surface.

One challenge with RIE is that attaining uniform etching is very difficult because the process provides no endpoint detection and typically relies exclusively on controlling the duration of the process to attain depth uniformity. However, as shown in FIG. 2, even identical materials typically etch at different rates—the RIE does not create surfaces 16 between pillars 14 having uniform height. As a result, any fin grown from surfaces 16 will inherently have different heights and different aspect ratios. This problem is oftentimes magnified because RIE chambers exhibit different etch rates over time and between periodic maintenance.

SUMMARY

A first aspect of the disclosure is directed to a method, comprising: depositing a germanium including layer over a substrate, the substrate including a plurality of sacrificial semiconductor fins, each pair of sacrificial semiconductor fins separated by a sacrificial pillar; diffusing germanium from the germanium including layer into the plurality of sacrificial semiconductor fins to a defined uniform depth; and etching the plurality of sacrificial semiconductor fins including the diffused germanium to the defined uniform depth and selective to the substrate, creating a plurality of trenches having a substantially uniform depth.

A second aspect of the disclosure includes a method, comprising: forming a plurality of sacrificial semiconductor fins separated by a plurality of sacrificial pillars in a substrate; depositing a germanium including layer over the substrate; annealing to diffuse germanium from the germanium including layer into the plurality of sacrificial semiconductor fins to a defined uniform depth; etching the plurality of sacrificial semiconductor fins including the diffused germanium to the defined uniform depth and selective to the substrate, creating a plurality of trenches having a substantially uniform depth; epitaxial growing a plurality of fins within the plurality of trenches; and removing the plurality of sacrificial pillars.

A third aspect of the disclosure related to a method, comprising: forming a plurality of sacrificial silicon fins separated by a plurality of sacrificial insulator pillars in a bulk silicon substrate; depositing a germanium including layer over the bulk silicon substrate; forming a cap layer over the germanium including layer; annealing to diffuse germanium from the germanium including layer into the plurality of sacrificial silicon fins to a defined uniform depth, causing the plurality of sacrificial silicon fins to become a plurality of silicon germanium fins; reactive ion etching selective to the bulk silicon substrate to remove the cap layer and remove the plurality of silicon germanium fins including the diffused germanium to the defined uniform depth, creating a plurality of trenches having a substantially uniform depth; epitaxial growing a plurality of fins within the plurality of trenches; and removing the plurality of sacrificial insulator pillars.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

DETAILED DESCRIPTION

Figure 1:
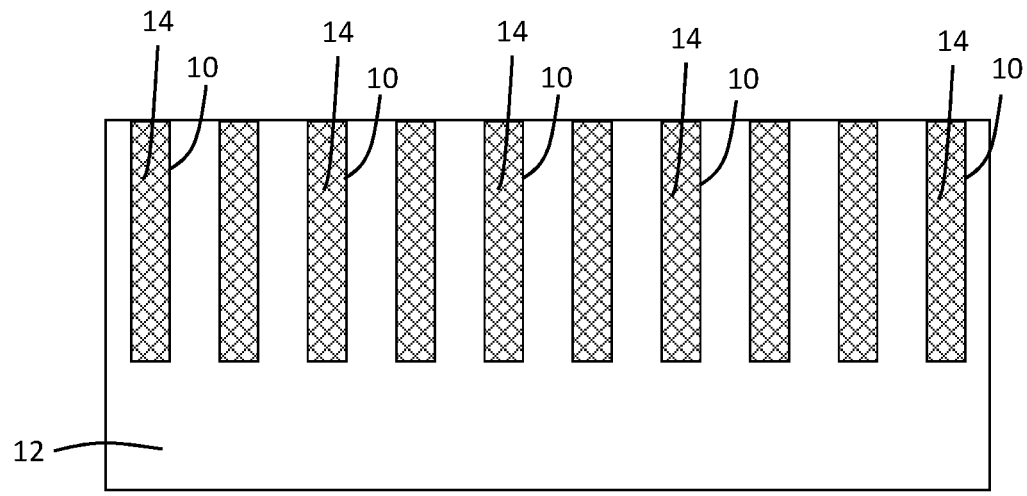
FIGS. 1-2 show cross-sectional views of a conventional method of forming trenches for semiconductor fins.

Referring to the drawings, FIGS. 3-6 show cross-sectional views of embodiments of a method for forming substantially uniform depth trenches for use in forming semiconductor fins having substantially uniform height according to embodiments of the disclosure.

Figure 3:
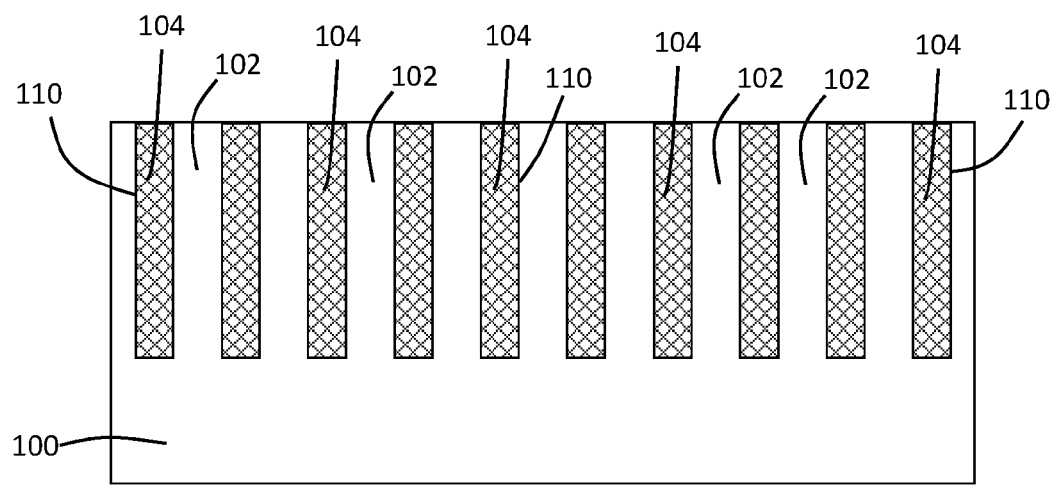
FIGS. 3-7 show cross-sectional views of a method of forming trenches for semiconductor fins according to embodiments of the disclosure.

FIG. 3 shows a cross-sectional view of a precursor structure that includes a substrate 100 including a plurality of sacrificial semiconductor fins 102 separated by a plurality of sacrificial pillars 104. That is, substrate 100 includes sacrificial semiconductor fins 102, each pair of sacrificial semiconductor fins 102 separated by a sacrificial pillar 104. Substrate 100 may include a bulk semiconductor such as but not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+ X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Sacrificial semiconductor fins 102 may be made of the same material as substrate 100.

Sacrificial semiconductor fins 102 may be formed in the substrate in a number of ways. In one example, plurality of trenches 110 may be formed into substrate 100 using photolithography techniques. A sacrificial material is then deposited into plurality of trenches 110 to form plurality of sacrificial pillars 104, and the sacrificial material is planarized to create a planar upper surface. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Sacrificial semiconductor fins 102 are thus formed between pillars 104. Sacrificial pillars 104 (sacrificial material) may include an insulator such as but not limited to silicon dioxide ($SiO_2$) or a nitride such as silicon nitride ($Si_3N_4$). In the example shown, silicon nitride is employed. The height/depth of pillars 104 and fins 102 may vary widely depending on the application for their use.

Figure 4:
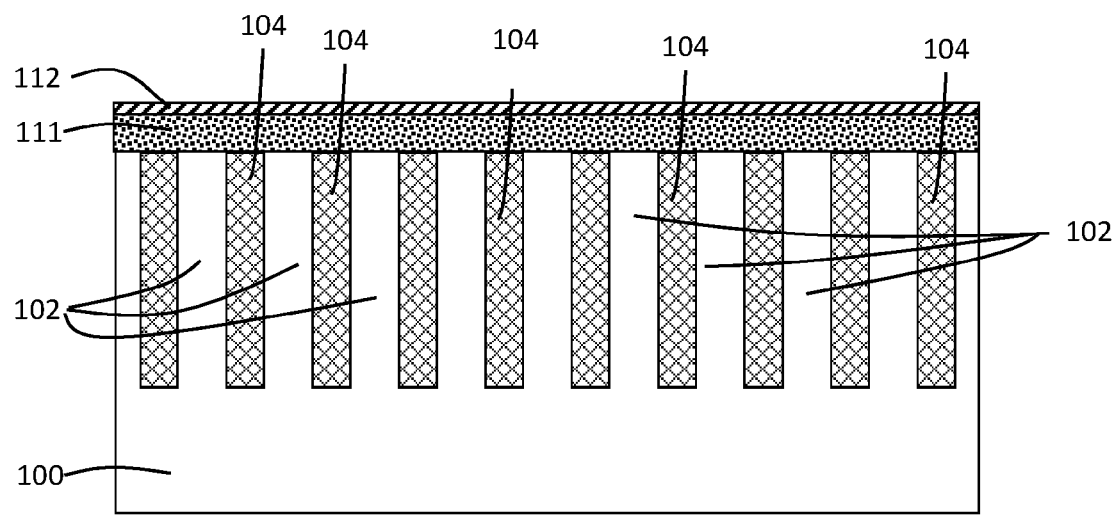

FIG. 4 shows depositing a germanium including layer 111 over substrate 100 including sacrificial semiconductor fins 102 separated by sacrificial pillars 104. In one embodiment, germanium including layer 111 may include germanium alone, which could be amorphous germanium. In another embodiment, germanium including layer 111 may include silicon germanium (SiGe). In any event, the layer may be formed, for example, using reduced pressure CVD (RP-CVD) at approximately 320-350° C. and to a thickness of approximately 10 nanometers (nm) to approximately 30 nm, followed by continued deposition of the rest of the layer at a raised temperature, e.g., approximately 600° C., to a final thickness of approximately 200 nm to approximately 1000 nm. As used herein, "approximately" indicates+/−10% of the upper and/or lower range limit. FIG. 4 also shows an optional step of forming a cap layer 112 over germanium including layer 111, e.g., by depositing cap layer 112. Cap layer 112 may include any now known or later developed cap material such as but not limited to silicon dioxide ($SiO_2$) or a nitride such as silicon nitride ($Si_3N_4$) or silicon oxynitride (SiON). In the example shown, silicon nitride is employed. Cap layer 112 may have a depth of, for example, approximately 100 nm to approximately 200 nm. It is emphasized that cap layer 112 is not necessary in all instances.

Figure 5:
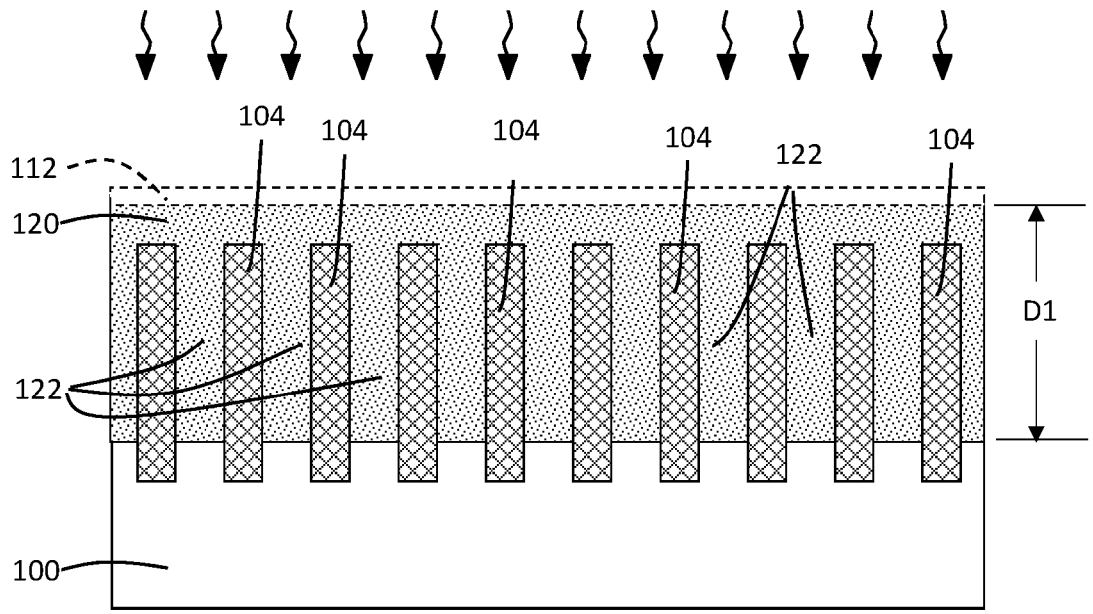

Referring to FIG. 5, germanium from germanium including layer 111 (FIG. 4) is diffused into plurality of sacrificial semiconductor fins 102 (FIG. 4) to a defined uniform depth D1. In one embodiment, the diffusion is obtained by performing an anneal. In contrast to RIE etching, diffusion depth D1 can be readily controlled by controlling the concentrations of germanium in germanium including layer 111 (FIG. 4) and by controlling the temperature and duration of the annealing. In one example, the anneal temperature may range from, for example, approximately 800° C. to approximately 1350° C., and in one embodiment may be approximately 1050° C. The anneal temperature may depend on the furnace or rapid thermal processing (RTP) technique employed. The duration of the anneal may be, for example, approximately 60 minutes to approximately 480 minutes, depending on the desired depth. Despite the aforementioned parameters, it is emphasized that the anneal parameters can vary widely depending on the application for the trenches. In any event, as illustrated in FIG. 5, germanium diffusion depth D1 is substantially uniform within sacrificial fins 122, which now include more germanium than as illustrated in FIG. 4. As used herein, "substantially uniform" indicates within +/−5 nm. As illustrated, germanium including layer 111 (FIG. 4) also has silicon diffused therein, creating a silicon germanium layer 120 over pillars 104 and under cap layer 112 (when employed, shown in phantom).

Figure 2:
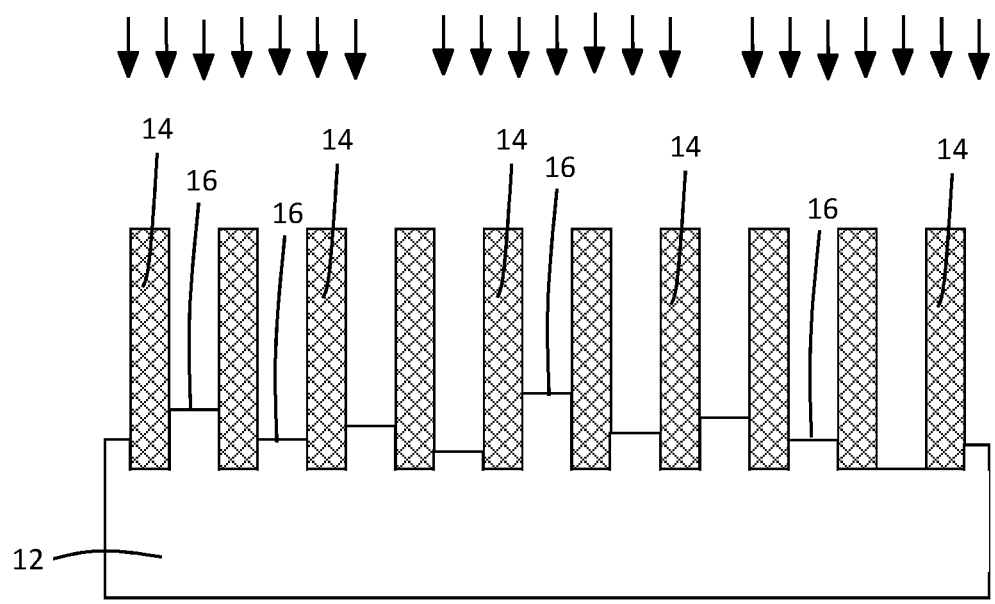
Figure 6:
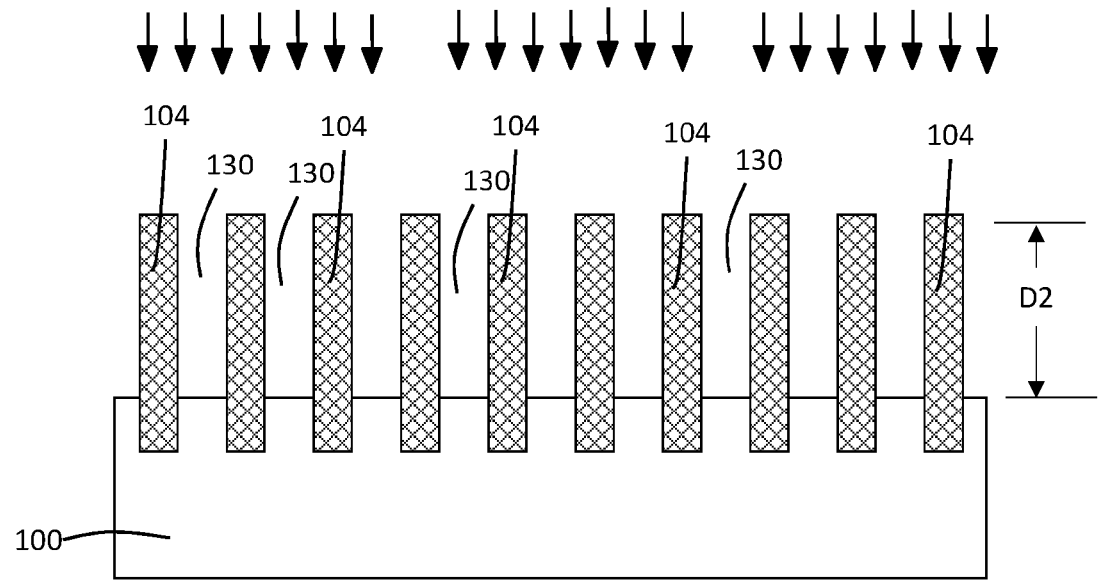

In FIG. 6, plurality of sacrificial semiconductor fins 122 (FIG. 5) are etched including the diffused germanium to the defined uniform depth and selective to substrate 100, creating a plurality of trenches 130 having a substantially uniform depth D2, i.e., relative to a top surface of pillars 104. Substantially uniform depth D2 is not necessarily the same as uniform depth D1 of germanium diffusion because silicon germanium layer 120 thickness and/or some thickness of pillars 104 is included in uniform depth D1. The etching may also remove cap layer 112, if employed, and any silicon germanium layer 120 (FIG. 5) above pillars 104. Alternatively, another etching could be performed prior to the afore-mentioned etching to remove cap layer 112. Some portion of pillars 104 may also be etched. In one embodiment, the etching includes reactive ion etching (RIE); however, other etching processes may also be employed. In contrast to conventional etching processes, as observed by comparing FIGS. 2 and 6, trenches 130 have a substantially uniform depth D2 because the silicon germanium fins 122 are more readily uniformly etched. The etching process is also less susceptible to RIE loading, depending on trench/fin width, and RIE chamber lifetime drift problems.

Figure 7:
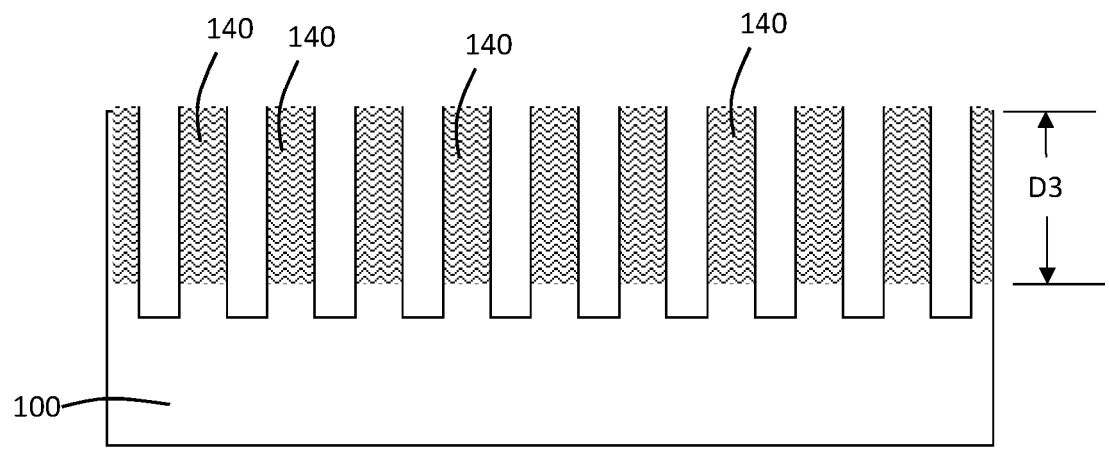

Consequently, as shown in FIG. 7 (with pillars 104 (FIG. 6) removed), semiconductor fins 140 can be epitaxially grown within the trenches 130 (FIG. 6), i.e., from substrate 100. Since fins 140 will start at the same point, they grow to be substantially uniform/equal height D3. Fins 140 may include any of the afore-listed semiconductor materials, either doped or undoped. As shown in FIG. 7, pillars 104 can be removed after forming fins 140, e.g., by using any now known or later developed etching technique appropriate for the pillar material.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   depositing a germanium including layer over a substrate, the substrate including a plurality of sacrificial semiconductor fins, each pair of sacrificial semiconductor fins separated by a sacrificial pillar;
   diffusing germanium from the germanium including layer into the plurality of sacrificial semiconductor fins to a defined uniform depth; and
   etching the plurality of sacrificial semiconductor fins including the diffused germanium to the defined uniform depth and selective to the substrate, creating a plurality of trenches having a substantially uniform depth.

2. The method of claim 1, wherein the substrate includes a bulk semiconductor, and the plurality of sacrificial semiconductor fins include silicon germanium after the diffusing.

3. The method of claim 1, wherein the sacrificial pillars include an insulator.

4. The method of claim 1, wherein the germanium including layer includes one of: amorphous germanium and silicon germanium.

5. The method of claim 1, further comprising planarizing the substrate prior to depositing the germanium including layer.

6. The method of claim 1, further comprising forming a cap layer over the germanium including layer prior to the diffusing, and removing the cap layer before the etching.

7. The method of claim 1, further comprising forming the plurality of sacrificial semiconductor fins in the substrate prior to the depositing the germanium including layer.

8. The method of claim 7, wherein forming the sacrificial semiconductor fins includes:
   etching another plurality of trenches into the substrate, the substrate including a semiconductor;
   depositing a sacrificial material into the another plurality of trenches to form the plurality of sacrificial pillars; and
   planarizing the sacrificial material.

9. The method of claim 1, wherein the diffusing germanium into the plurality of sacrificial semiconductor fins includes annealing to diffuse germanium into the plurality of sacrificial semiconductor fins.

10. The method of claim 1, wherein etching the plurality of sacrificial semiconductor fins includes applying reactive ion etching (RIE) in etching the plurality of sacrificial semiconductor fins.

11. The method of claim 1, further comprising epitaxial growing a plurality of fins within the plurality of trenches.

12. A method, comprising:
    forming a plurality of sacrificial semiconductor fins separated by a plurality of sacrificial pillars in a substrate;
    depositing a germanium including layer over the substrate;
    annealing to diffuse germanium from the germanium including layer into the plurality of sacrificial semiconductor fins to a defined uniform depth;
    etching the plurality of sacrificial semiconductor fins including the diffused germanium to the defined uniform depth and selective to the substrate, creating a plurality of trenches having a substantially uniform depth;
    epitaxial growing a plurality of fins within the plurality of trenches; and
    removing the plurality of sacrificial pillars.

13. The method of claim 12, wherein the substrate includes a bulk semiconductor, and the plurality of sacrificial semiconductor fins include silicon germanium after the diffusing.

14. The method of claim 12, wherein the sacrificial pillars include an insulator.

15. The method of claim 12, wherein the germanium including layer includes one of: amorphous germanium and silicon germanium.

16. The method of claim 12, further comprising planarizing the substrate prior to depositing the germanium including layer.

17. The method of claim 12, further comprising forming a cap layer over the germanium including layer prior to the diffusing, and removing the cap layer before the etching.

18. The method of claim 12, wherein the plurality of sacrificial semiconductor fins forming includes:
    etching another plurality of trenches into the substrate, the substrate including a semiconductor;
    depositing a sacrificial material into the another plurality of trenches to form the plurality of sacrificial pillars; and
    planarizing the sacrificial material.

19. The method of claim 18, wherein etching the plurality of sacrificial semiconductor fins includes applying reactive ion etching (RIE) in etching the plurality of sacrificial semiconductor fins.

20. A method, comprising:
    forming a plurality of sacrificial silicon fins separated by a plurality of sacrificial insulator pillars in a bulk silicon substrate;
    depositing a germanium including layer over the bulk silicon substrate;
    forming a cap layer over the germanium including layer;
    annealing to diffuse germanium from the germanium including layer into the plurality of sacrificial silicon fins to a defined uniform depth, causing the plurality of sacrificial silicon fins to become a plurality of silicon germanium fins;
    reactive ion etching selective to the bulk silicon substrate to remove the cap layer and remove the plurality of silicon germanium fins including the diffused germanium to the defined uniform depth, creating a plurality of trenches having a substantially uniform depth;
    epitaxial growing a plurality of fins within the plurality of trenches; and
    removing the plurality of sacrificial insulator pillars.

* * * * *